US010797798B2

(12) United States Patent
Yu et al.

(10) Patent No.: US 10,797,798 B2
(45) Date of Patent: Oct. 6, 2020

(54) OPTICAL POWER AND GAIN DETECTION APPARATUS AND METHOD FOR OPTICAL AMPLIFIER IN BURST MODE

(71) Applicant: Accelink Technologies Co., Ltd., Wuhan, Hubei (CN)

(72) Inventors: Long Yu, Wuhan (CN); Weiqing Zhang, Wuhan (CN); Chunyu Li, Wuhan (CN); Zhi Chen, Wuhan (CN); Chunping Yu, Wuhan (CN); Qinlian Bo, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 0 days.

(21) Appl. No.: 16/345,815

(22) PCT Filed: Dec. 19, 2016

(86) PCT No.: PCT/CN2016/110664
§ 371 (c)(1),
(2) Date: Jul. 24, 2019

(87) PCT Pub. No.: WO2018/076501
PCT Pub. Date: May 3, 2018

(65) Prior Publication Data
US 2019/0372672 A1   Dec. 5, 2019

(30) Foreign Application Priority Data

Oct. 27, 2016   (CN) .......................... 2016 1 0950093

(51) Int. Cl.
*H04B 10/00* (2013.01)
*H04B 10/293* (2013.01)
(Continued)

(52) U.S. Cl.
CPC ....... *H04B 10/2931* (2013.01); *H03G 3/3084* (2013.01); *H04J 14/0221* (2013.01)

(58) Field of Classification Search
USPC .......................... 359/333–349; 398/202–214
See application file for complete search history.

(56) References Cited

U.S. PATENT DOCUMENTS

| 5,929,982 | A | * | 7/1999 | Anderson | ................ H03G 3/24 |
|---|---|---|---|---|---|
| | | | | | 250/214 AG |
| 5,953,690 | A | * | 9/1999 | Lemon | ................ H03G 3/3089 |
| | | | | | 250/214 C |

(Continued)

FOREIGN PATENT DOCUMENTS

| CN | 1391739 A | 1/2003 |
|---|---|---|
| CN | 1495500 A | 5/2004 |

(Continued)

OTHER PUBLICATIONS

International Search Report from International Application No. PCT/CN2016/110664 dated Aug. 9, 2017.

(Continued)

*Primary Examiner* — Agustin Bello
(74) *Attorney, Agent, or Firm* — Lerner, David, Littenberg, Krumholz & Mentlik, LLP

(57) ABSTRACT

An optical power and gain detection apparatus including multiple optical power detection circuits, an FPGA device, and a temperature detection circuit. Various optical power detection circuits include a respective independent photoelectric converter, a trans-impedance amplifier, an analog signal conditioning circuit, a filter and an analog-digital conversion chip. By improving an analog circuit, digital detection and control in an optical amplifier, the property of the FPGA device may be used to realize the detection of optical signal and gain in a burst mode, avoid increasing complicated analogue circuits, and avoid the influence caused by element inconsistency in an analogue control solution. Whether the optical signal is in a stable mode or in a burst mode, the algorithm can detect the optical power (Continued)

accurately and stably, with a wide application range. By strictly controlling the synchronism of ADC sampling and the delay of calculation, the amplifier gain may be calculated more accurately.

10 Claims, 5 Drawing Sheets

(51) Int. Cl.
  *H03G 3/30* (2006.01)
  *H04J 14/02* (2006.01)

(56) References Cited

U.S. PATENT DOCUMENTS

| | | | | |
|---|---|---|---|---|
| 6,313,459 B1* | 11/2001 | Hoffe | H01L 31/02027 | 250/214 AG |
| 6,490,080 B2* | 12/2002 | Cornelius | H04B 10/077 | 359/341.41 |
| 6,535,308 B1* | 3/2003 | BuAbbud | H04B 10/43 | 372/101 |
| 6,643,472 B1* | 11/2003 | Sakamoto | H04B 10/66 | 250/214 R |
| 6,934,076 B1* | 8/2005 | Goobar | H04B 10/2931 | 359/337 |
| 6,941,079 B1* | 9/2005 | Barozzi | H04B 10/077 | 359/337 |
| 7,155,133 B2* | 12/2006 | Stewart | H04B 10/6911 | 398/202 |
| 7,212,798 B1* | 5/2007 | Adams | H03G 3/3068 | 330/278 |
| 7,224,515 B2* | 5/2007 | Fourte | H01S 3/13013 | 359/337.1 |
| 7,317,769 B2* | 1/2008 | Tonietto | G11B 20/10009 | 342/151 |
| 7,326,921 B2* | 2/2008 | Matsumoto | H01L 31/02027 | 250/214 C |
| 7,439,481 B2* | 10/2008 | Kaku | G01J 1/4257 | 250/214 A |
| 7,466,922 B2* | 12/2008 | Pierce | H04B 10/40 | 398/135 |
| 7,495,203 B2* | 2/2009 | Kaku | H04B 10/0799 | 250/214 A |
| 7,555,228 B2* | 6/2009 | Ruegg | G01J 1/44 | 398/202 |
| 7,676,152 B2* | 3/2010 | Yamabana | H04B 10/07955 | 250/214 A |
| 7,709,778 B2* | 5/2010 | Teeter | H03F 3/087 | 250/214 R |
| 7,822,349 B2* | 10/2010 | Roosli | H04B 10/114 | 250/214 A |
| 7,826,752 B1* | 11/2010 | Zanoni | H04B 10/5055 | 398/186 |
| 7,970,291 B2* | 6/2011 | Nagakubo | H04B 10/6911 | 250/214 A |
| 8,050,573 B2* | 11/2011 | Zhang | H04B 10/69 | 375/319 |
| 8,081,948 B2* | 12/2011 | Pinel | G06G 7/12 | 359/334 |
| 8,145,060 B2* | 3/2012 | Hufstedler | H04B 10/6911 | 398/135 |
| 8,160,457 B2* | 4/2012 | McCaul | H04B 10/693 | 250/214 A |
| 8,195,055 B2* | 6/2012 | Vieira | H04B 10/6911 | 398/202 |
| 8,369,715 B2* | 2/2013 | Yang | H04B 10/03 | 398/209 |
| 8,374,501 B2* | 2/2013 | Yoshiuchi | H04J 3/1694 | 398/208 |
| 8,792,785 B2* | 7/2014 | Jiang | H04B 10/69 | 398/202 |
| 8,983,289 B2* | 3/2015 | Zhou | H04B 10/6165 | 398/203 |
| 9,203,509 B2* | 12/2015 | Wang | H04B 10/07955 | |
| 9,923,642 B2* | 3/2018 | Shirai | G01J 1/44 | |
| 2002/0131159 A1* | 9/2002 | Ye | H04B 10/2941 | 359/337.2 |
| 2003/0030893 A1* | 2/2003 | Cornelius | H04B 10/07955 | 359/341.4 |
| 2003/0210917 A1* | 11/2003 | Stewart | H04B 10/6911 | 398/209 |
| 2004/0136729 A1* | 7/2004 | Robinson | H01S 5/042 | 398/183 |
| 2004/0202476 A1* | 10/2004 | Woolf | H04B 10/40 | 398/135 |
| 2004/0253003 A1* | 12/2004 | Farmer | H04N 7/17309 | 398/214 |
| 2005/0248833 A1* | 11/2005 | Fourte | H01S 3/13013 | 359/337.13 |
| 2007/0058989 A1* | 3/2007 | Kaku | H04B 10/0799 | 398/209 |
| 2007/0264014 A1* | 11/2007 | McClean | H04B 10/2931 | 398/37 |
| 2008/0089681 A1 | 4/2008 | Yano | | |
| 2008/0142713 A1* | 6/2008 | Breed | B60N 2/002 | 250/330 |
| 2008/0247766 A1* | 10/2008 | McCaul | H04B 10/693 | 398/202 |
| 2009/0196632 A1* | 8/2009 | Zhang | H04B 10/69 | 398/202 |
| 2009/0238582 A1* | 9/2009 | Tsunoda | H01L 31/02027 | 398/208 |
| 2010/0178065 A1* | 7/2010 | Nishihara | H04B 10/61 | 398/202 |
| 2011/0158656 A1* | 6/2011 | Vieira | H04B 10/6911 | 398/202 |
| 2012/0321299 A1 | 12/2012 | Oguma | | |
| 2013/0108278 A1* | 5/2013 | Azadeh | H04B 10/695 | 398/202 |
| 2013/0209090 A1* | 8/2013 | Rope | H04B 17/101 | 398/25 |
| 2014/0147110 A1* | 5/2014 | Seo | H04B 10/6932 | 398/25 |
| 2015/0155951 A1* | 6/2015 | Noda | H03G 3/3084 | 398/202 |
| 2016/0197674 A1 | 7/2016 | Ruchet et al. | | |
| 2019/0372672 A1* | 12/2019 | Yu | H04B 10/0797 | |

FOREIGN PATENT DOCUMENTS

| | | |
|---|---|---|
| CN | 1595275 A | 3/2005 |
| CN | 101141204 A | 3/2008 |
| CN | 101510802 A | 8/2009 |
| CN | 102324969 A | 1/2012 |
| CN | 103438995 A | 12/2013 |
| CN | 104466673 A | 3/2015 |
| EP | 2521287 A1 | 11/2012 |
| JP | 2011142544 A | 7/2011 |
| WO | 2007134635 A1 | 11/2007 |
| WO | 2011079656 A1 | 7/2011 |

OTHER PUBLICATIONS

Extended European Search Report including Written Opinion for EP16919711.8 dated Jun. 12, 2020; 10 pages.

\* cited by examiner

OPTICAL POWER AND GAIN DETECTION APPARATUS AND METHOD FOR OPTICAL AMPLIFIER IN BURST MODE

CROSS-REFERENCE TO RELATED APPLICATIONS

The present application is a national phase entry under 35 U.S.C. § 371 of International Application No. PCT/CN2016/110664 filed Dec. 19, 2016, published in Chinese, which claims priority from CN 201610950093.3 filed Oct. 27, 2016, all of which are incorporated herein by reference.

TECHNICAL FIELD

The present disclosure relates to optical communication technology, and more particularly to improvement on an optical amplifier, and particularly to an apparatus and method for detecting optical power and gain of an optical amplifier in a burst mode. The present disclosure is used to solve a problem of detecting optical power and gain of an optical amplifier in the communication field, and is mainly used to accurately detect optical power and gain in a burst mode in the field of passive optical network for broadband optical fiber access.

BACKGROUND

The access network is a bridge for users to enter a metropolitan area network/backbone network, and is the "last-mile network" of information transmission channel. With the development of internet and gradual emergence of high-bandwidth consumption services, bandwidth acceleration has become an urgent demand. In order to meet the demand of users, various new technologies are continuously emerging, and access network technology has become a research focus and an investment hotspot.

Among various broadband access technologies, a passive optical network (PON) has become a popular technology due to its advantages, such as large capacity, long transmission distance, low cost, and full-service support, etc. The PON system is a pure medium network, which avoids electromagnetic interference of external device and lightning effect, reduces the failure rate of line and external device, improves system reliability, and saves maintenance costs, accordingly, it is most widely used.

The PON system mainly includes an optical line terminal (OLT), an optical distribution network (ODN), and an optical network unit (ONU) at a local end. PON is a point-to-multipoint optical fiber transmission and access technology. Data from the OLT to the ONU transmits in a downstream direction, which uses a broadcast mode. Data from the ONU to the OLT transmits in an upstream direction, which uses time division multiple access (TDMA), i.e. a burst mode.

In order to extend an optical communication distance from the OLT to the ONU and improve a signal-to-noise ratio, an optical amplifier is usually added at the OLT side. For the downstream direction, a data rate transmitted by the OLT is much higher than detection bandwidth, and optical signal power is stable, and all of the conventional optical amplifiers may accurately detect optical power and gain. However, for the upstream direction, each ONU works in the burst mode, and only a data packet is transmitted, there will be an optical signal on an optical fiber; when there is no data, the ONU is in an idle state and does not transmit any optical signal, therefore, the optical signal over the optical fiber in the upstream direction is in the burst mode, which puts forward new requirements to the design of optical amplifier in the upstream direction, especially the power detection and the gain calculation.

Specifically, for detecting optical power, the conventional optical amplifier mainly includes a photoelectric converter, a trans-impedance amplifier, an ADC conversion chip, a single-chip microcomputer, and the like. The photoelectric converter converts an optical signal into a current signal, and the trans-impedance amplifier converts a current signal into a voltage signal, and the ADC conversion chip converts an analog voltage signal into a digital signal and transmits it to the single chip microcomputer. Since an operation speed of the single-chip microcomputer is slow, the single-chip microcomputer may detect the accurate optical power only when the optical power changes slowly. Since the single-chip microcomputer may only be operated in series, the input and output optical power cannot be simultaneously sampled, therefore, for the burst mode, accurate gain cannot be obtained.

In the prior art, the optical power and gain detection in the burst mode may be realized through both an analog aspect and a digital aspect, and different detection apparatuses and methods affect the detection cost and performance. For example, a patent "Receiving end light power on-line detection device and implementation method thereof" (Patent No. 201110200643.7) needs to add a BNC terminal and other acquisition modules on a universal ONU module, and an algorithm itself needs to add an additional trigger signal; a patent "Method and system for facilitating burst-mode optical power measurement" (Patent No. 200610093150.7) adopts a mode of adding a current mirror and a complicated analog circuit, which goes against its use in an optical amplifier. All of the implementation modes in the prior art need to modify the ONU module, and even modify the algorithm, which increases the complexity of the system design and does not meet the development requirements of the current broadband communication system.

The present disclosure fully uses the design of current amplifier, and combines the advantages of digital circuit and FPGA device, and provides an apparatus and method for detecting optical power and gain of an optical amplifier in a burst mode; the present disclosure does not need to make any modifications to the ONU module, and may more adapt to the use of the current broadband communication system, meanwhile, the algorithm directly uses the sampled analog signal to process, and it does not need to add a trigger circuit on the hardware, which reduces the complexity of the system design.

SUMMARY

In order to overcome some defects of detection for optical power and gain in existing optical amplifiers, the present disclosure proposes an apparatus and method for detecting optical power and gain in a burst mode.

The technical problem to be solved in the present disclosure is to implement detection for optical power and gain of an optical amplifier in a burst mode, mainly in a passive optical network, when the system polls input and output optical power and gain of an optical amplifier, the optical amplifier may timely and accurately report numerical values.

In order to solve the above technical problems, the present disclosure provides an apparatus for detecting optical power in a burst mode, comprising: multiple optical power detection circuits, an FPGA device, and a temperature detection circuit; wherein each optical power detection circuit adopts the same structure and implementation mode and comprises a photoelectric converter, a trans-impedance amplifier, an analog signal conditioning circuit, a filter and an analog-digital conversion chip which are respectively independent; in each optical power detection circuit, the photoelectric converter is used to convert an optical signal of a corresponding optical path into a current signal, the trans-impedance amplifier is used to convert the current signal output by the photoelectric converter into a voltage signal, the analog signal conditioning circuit is used to correct the voltage signal output by the trans-impedance amplifier, amplify and translate the voltage signal, the filter is used to filter out a high frequency interference signal in the voltage signal output by the analog signal conditioning circuit, the analog-digital conversion chip converts the filtered analog voltage signal into a digital signal and outputs the same to the FPGA device; the FPGA device calculates optical power and gain of each optical path from the digital signal input by the corresponding optical path.

In the above technical solution, the temperature detection circuit comprises a temperature sensor for detecting temperature of the optical amplifier and converting the detected temperature into a digital signal and then transmitting the digital signal to the FPGA device, and the FPGA device compensates the obtained optical power and/or gain based on the detected temperature value.

In the above technical solution, the FPGA device further includes a communication interface for setting a power threshold, a time interval of a timer, and a temperature compensation coefficient.

In the above technical solution, the optical amplifier may be a Raman fiber amplifier, an erbium-doped fiber amplifier, an ytterbium-doped fiber amplifier, a hybrid fiber amplifier, and a high-power fiber amplifier.

In the above technical solution, an analog signal detected by each optical power detection circuit is converted into a digital signal by the analog-digital conversion chip and transmitted to the FPGA device, the FPGA device calculates actual optical power based on a calibration coefficient pre-stored in a parameter table; when the actual optical power exceeds a set threshold, a detection state machine inside the FPGA device is triggered, the FPGA device performs a moving average on valid optical power, records a valid value thereof, and performs a power determination at the same time, only when an optical power value detected at this time exceeds an optical power value detected at last time, the numerical value in a memory inside the FPGA device is updated, otherwise, the optical power value detected at this time will be abandoned, thus it is ensured that what is stored in the memory inside the FPGA device is the maximum optical power value in the burst mode.

In the above technical solution, a timer is provided inside the FPGA device; when the numerical value in the memory inside the FPGA device is updated, the timer starts timing; when a timing time exceeds a set value, or an update command is received by the FPGA device through the communication interface, the numerical value in the memory inside the FPGA device is updated again.

In the above technical solution, the FPGA device further includes a temperature compensation parameter table for compensating an optical power calculation by using temperature data input by the temperature detection circuit.

The present disclosure further provides a method for detecting optical power of an optical amplifier, comprising:

step 401, initializing an optical power detection module, in an initial state, configuring an analog-digital conversion chip in each optical power detection circuit by an FPGA device, and after the configuration is completed, proceeding to step 402;

step 402, starting ADC sampling, continuously sampling, and outputting converted optical power data to the FPGA device by an analog-digital conversion chip, proceeding to step 403;

step 403, reading, by the FPGA device, sampled data input by the analog-digital conversion chip, calculating, by the FPGA device, currently detected optical power, and proceeding to step 404;

step 404, determining whether to perform a data update operation by determining whether an update data command is received, if the update data command is received, proceeding to step 405, otherwise proceeding to step 406;

step 405, updating data with the current optical power value, and returning to step 404;

step 406, comparing the optical power value calculated by the FPGA device with a preset threshold, when the optical power value is less than the preset threshold, it indicating that what is detected by the sampling of at this time is a non-optical-signaled state, and the data is invalid, proceeding to step 407; when the optical power value exceeds the preset threshold, it indicating that what is detected by the sampling at this time is in an optical-signaled state, and proceeding to step 408;

step 407, starting an internal timer timing, and then proceeding to step 409;

step 408, comparing the currently detected optical power value with the optical power value detected at last time, if the currently detected optical power value is less than the optical power value detected at last time, the current optical power value being considered to be invalid, proceeding to step 407, otherwise, the current optical power value being considered to be valid, proceeding to step 410;

step 409, determining whether a timing time of the internal timer reaches a preset delay, if the preset delay is reached, proceeding to step 411, otherwise, proceeding to step 404;

step 410, performing a moving average on the currently detected optical power value with the optical power values obtained from previous N detections to obtain the current optical power value so as to reduce influence of noise interference, and then proceeding to step 411;

step 411, resetting the internal timer, and proceeding to step 405.

In the above technical solution, the FPGA device stores a temperature compensation coefficient table in form of a lookup table, obtains a compensation coefficient by looking up the lookup table according to temperature data input by a temperature detection circuit, and multiplies the compensation coefficient with the currently detected power to obtain an actual optical power value at the current temperature.

The present disclosure further provides a method for detecting gain of an optical amplifier, comprising:

completing, by a FPGA device, initialization of a variable and a storage space, and then entering, by the FPGA device, a synchronization control state to ensure that a clock signal and a control signal of an ADC analog-digital conversion chip in each detection circuit are completely identical, such that the ADC analog-digital conversion chip in an input channel and the ADC analog-digital conversion chip in an output channel operate in a simultaneous sampling state;

calculating, by the FPGA device, input optical power of the input channel and input optical power of the output channel, respectively, and then determining, by the FPGA device, validity of the detected input optical power and output optical power;

when the detected input optical power or the detected output optical power is less than a threshold, indicating that an invalid value is detected, and starting a timer; if a timing time is exceeded, updating gain data and at the same time indicating a current gain value as invalid data, and clearing the timer, and performing a next gain detection process;

when the detected input optical power or the detected output optical power is greater than the threshold, indicating that a valid value is detected, and determining whether an update command is received, if the update command is received, updating the gain data immediately, otherwise, calculating the gain of the optical amplifier from the input optical power and the output optical power, storing the gain data, performing a moving average, and updating the gain data with data after performing moving average, clearing the timer, and performing the next gain detection process.

The present disclosure further comprises a communication interface and a parameter table which are used for dynamically controlling length, threshold size and temperature compensation coefficient of a timer. By adjusting various parameters, the precision and time requirements of detection are met.

The present disclosure further comprises simply copying a control module inside the FPGA device to realize multiple optical signals and gain circuits operate simultaneously, and the used external devices are significantly reduced.

The present disclosure achieved the following technical effects:

Firstly, adding a complicated analogue circuit is avoided, meanwhile, the influence caused by element inconsistency in an analogue control solution is also avoided. The requirement of consistency may be achieved for the device based on digital control solutions, only by a simple calibration.

Secondly, whether the optical signal is in a stable mode or in a burst mode, the algorithm may accurately and stably detect optical power with a wider application range. The internal storage data is always the latest and valid data, which reflects the optical signal over the fiber in real time and accurately. The amplifier gain is calculated more accurately through strictly controlling the sampling synchronism of ADC and delay of calculation.

Finally, a temperature detection circuit and a compensation coefficient are added to improve the detection precision of the system. The property of the FPGA device is fully used to perform multiple control without affecting performance.

REFERENCE SIGNS

Figure 1:
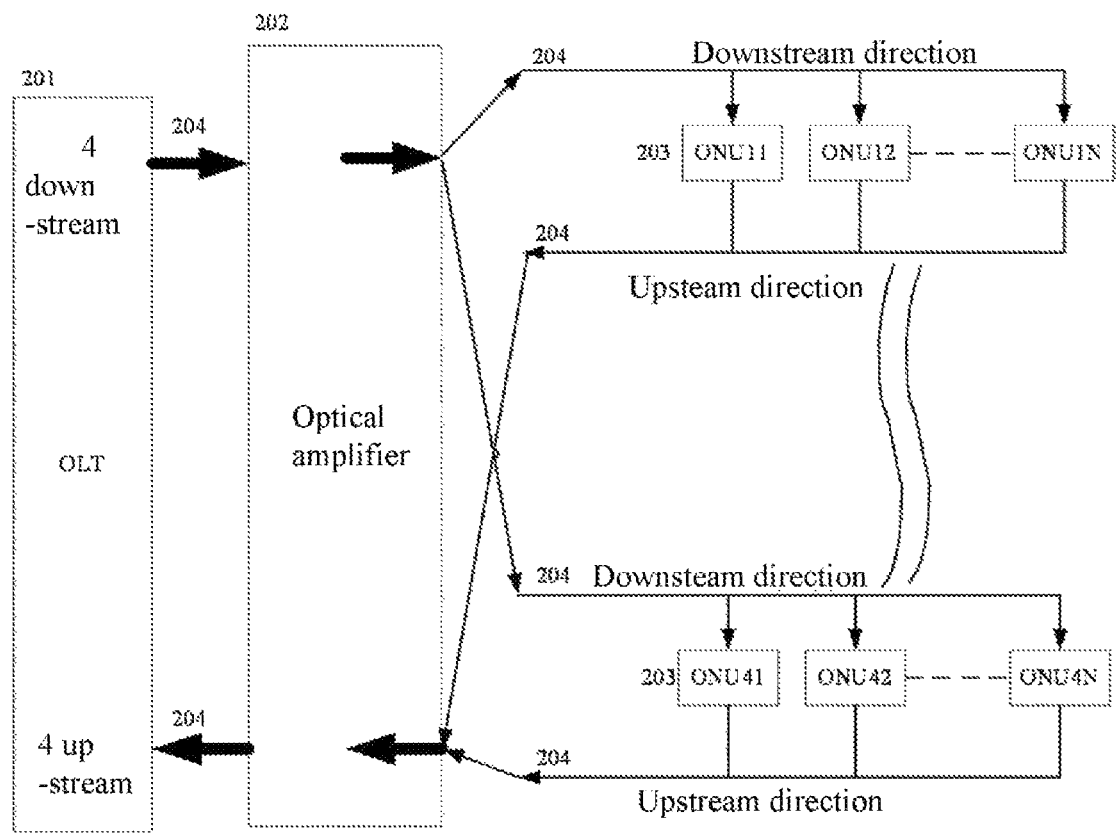
FIG. 1 is a schematic diagram of a PON system.

101 First optical power detection circuit
102 Photoelectric converter
103 Trans-impedance amplifier
104 Analog signal conditioning circuit
105 Filter
106 High-speed and high-precision ADC analog-digital conversion chip
107 FPGA device
108 Temperature detection circuit
109 Nth optical power detection circuit
201 OLT unit
202 Optical amplifier
203 ONU unit
204 Optical fiber connection line
301 Downstream direction
302 Upstream direction
303 Sampling

DESCRIPTION OF EMBODIMENTS

In order to facilitate the understanding and implementation of the present disclosure by those skilled in the art, the present disclosure will be further described in detail below with reference to drawings and embodiments.

A typical PON system is simplified as shown in FIG. 1, and mainly includes: an OLT unit 201, an optical amplifier 202, a plurality of ONU units 203, and an optical fiber connection line 204; in order to increase a transmission distance and improve a signal-to-noise ratio, an optical amplifier 202 is provided between the OLT unit 201 and the ONU (i.e. the plurality of ONU units 203). Upstream ports and downstream ports of the OLT unit 201 are four ports, therefore, for the corresponding optical amplifier 202, it is also necessary to simultaneously support detection and amplification of four upstream signals and four downstream signals (i.e. required to support the detection and amplification of 8 signals). In the typical PON system, each downstream output terminal (4 downstream output terminals are shown in the figure, and other quantity is also possible) of the OLT unit 201 is connected to an input terminal of a corresponding optical path downstream amplification of the optical amplifier 202 through an optical fiber, an output terminal of a corresponding optical path downstream amplification of the optical amplifier 202 is connected to an input terminal of the plurality of ONU units 203 through an optical fiber, an output terminal of the plurality of ONU units is connected to an input terminal of a corresponding optical path upstream amplification of the optical amplifier 202, and an output terminal of a corresponding optical path upstream amplification of the optical amplifier 202 is connected to an input terminal of a corresponding optical path upstream amplification of OLT unit 201 through an optical fiber.

Figure 2:
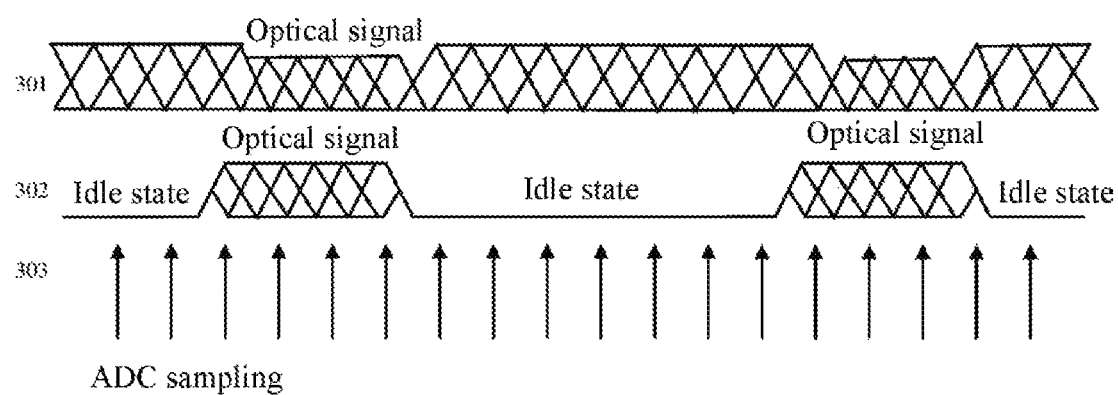
FIG. 2 is a sampling diagram of a burst mode.

Detection and sampling of optical signal power of the optical amplifier 202 are shown in FIG. 2: for a downstream direction 301, since there is always an optical signal over the optical fiber, a change of the optical signal power is relatively slow, and for an upstream direction 302, when there is no data transmitted, there is no optical signal over the optical fiber, and it is in an idle state; when there is data service, an optical signal suddenly appears over the optical fiber. In order to convert the optical signal in the direction of the corresponding optical path into a voltage signal, the ADC chip in the optical amplifier 202 continuously performs ADC sampling 303. For the downstream direction 301, the valid optical power may always be sampled by the ADC chip, and the corresponding (suitable) optical power may always be read by the PON system (the OLT unit 201 therein) through a communication interface. For a burst mode of the optical signal in the upstream direction 302, if the PON system is not synchronized with the ADC sampling on the optical amplifier 202, it is possible to always read optical power of an idle state, i.e. invalid power. Since the optical power detected on the upstream optical path is invalid, the calculation, by the optical amplifier 202, of the internal gain of the corresponding upstream optical path may also be invalid. Further, temperature of the optical amplifier 202 itself changes during operating, and temperature compensation must also be considered in order to improve accuracy.

That is to say, the technical problem to be solved in the present disclosure is to implement detection for optical power and gain of an optical amplifier in a burst mode, especially in a passive optical network, when the PON system polls input and output optical power and gain of the optical amplifier, the optical amplifier may timely and accurately report numerical values.

Figure 3:
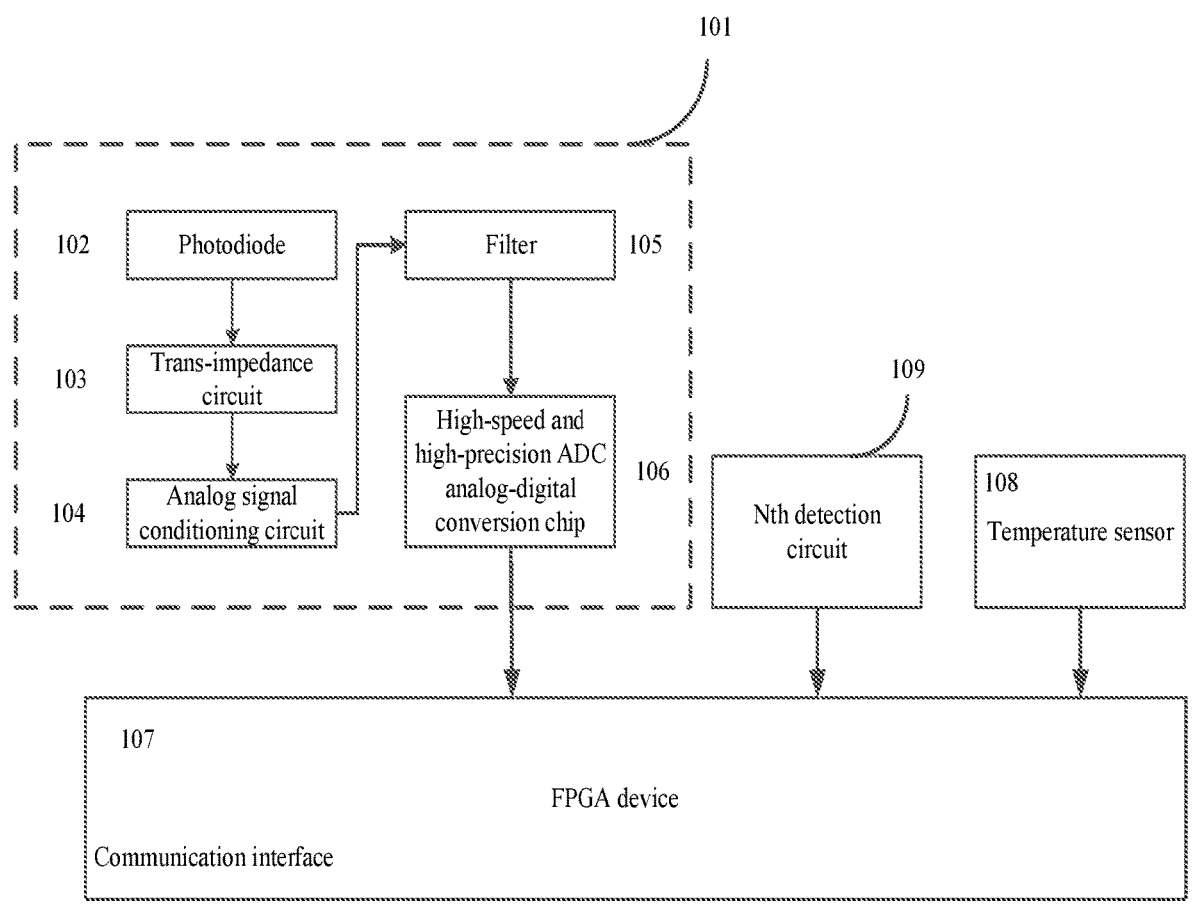
FIG. 3 is a structural principle diagram of an apparatus for detecting optical power and gain of an optical amplifier in a burst mode according to the present disclosure.

In order to solve the above technical problem, the present disclosure provides an apparatus for detecting optical power and gain of an optical amplifier in a burst mode, as shown in FIG. 3, comprising: multiple optical power detection circuits 101-109 and an FPGA device 107, a temperature detection circuit 108; wherein the first optical power detection circuit 101 to the N-th optical power detection circuit 109 adopt the same structure and implementation mode, and each comprises a photoelectric converter 102, a trans-impedance amplifier 103, an analog signal conditioning circuit 104, a filter 105, a high-speed and high-precision ADC analog-digital conversion chip 106 which are respectively independent.

Wherein, the photoelectric converter 102 in each optical power detection circuit is used to convert an optical signal of a corresponding optical path into a current signal, which may be implemented by using a photodiode; the trans-impedance amplifier 103 is used to convert the current signal output by the photoelectric converter 102 into a voltage signal; the analog signal conditioning circuit 104 is used to correct the voltage signal output by the trans-impedance amplifier 103, and amplify and translate the voltage signal to adjust the amplitude thereof to a range suitable for the high-speed and high-precision ADC analog-digital conversion chip 106; the filter 105 is used to filter out a high frequency interference signal in the signal output by the analog signal conditioning circuit 104 to improve the signal-to-noise ratio. The high-speed and high-precision ADC analog-digital conversion chip 106 converts the analog signal output by the analog signal conditioning circuit 104 into a digital signal and outputs the same to the FPGA device 107. The FPGA device 107 calculates optical power and gain of the corresponding optical path from digital signals input by each optical path (in modes of lookup table or index, logarithm operation, etc.). The temperature detection circuit 108 includes a temperature sensor provided on an optical amplifier. The temperature sensor is used to detect temperature of the optical amplifier, and convert the detected temperature into a digital signal and then transmitting the signal to the FPGA device 107, and the FPGA device 107 compensates the detected optical power/gain of the optical amplifier based on the detected temperature value. The FPGA device 107 further includes a communication interface for connecting the FPGA device 107 and the (PON) system to set a power threshold, a time interval of a timer, a temperature compensation coefficient, or other parameters and commands of the (PON) system.

The optical amplifiers targeted may be a Raman fiber amplifier, an erbium-doped fiber amplifier, an ytterbium-doped fiber amplifier, a hybrid fiber amplifier, and a high-power fiber amplifier, etc.

In a method for detecting optical power and gain on various optical paths in each direction of a PON system by using the apparatus for detecting optical power and gain provided by the present disclosure, an analog signal obtained through sampling in each optical power detection circuit is converted into a digital signal by the ADC analog-digital conversion chip 106 and transmitted to the FPGA device 107, and the FPGA device 107 calculates actual optical power based on a calibration coefficient prestored in a parameter table. And the power in milliwatt (mW) and decibel milliwatt (dBm) are obtained simultaneously for subsequent control needs by an index operation and a logarithmic operation. When the power exceeds a certain threshold, a detection state machine inside the FPGA device 107 is triggered. The FPGA device 107 performs a moving average on valid optical power, records the valid value at this time, and performs power determination at the same time. Only when the value detected at this time exceeds the detected value at last time, a numerical value in an internal memory is updated, otherwise, the value detected at this time will be abandoned, i.e. it is ensured that what is stored in the internal memory is the maximum value of the burst packet. A timer is provided inside the FPGA device 107. When the numerical value in the internal memory is updated, the timer starts timing. When a timing time exceeds a preset value, or an update command is received through the communication interface, the numerical value in the internal memory is updated again and the newly detected optical power is stored. The FPGA device 107 also includes a temperature compensation parameter table to improve detection precision of optical power.

Figure 4:
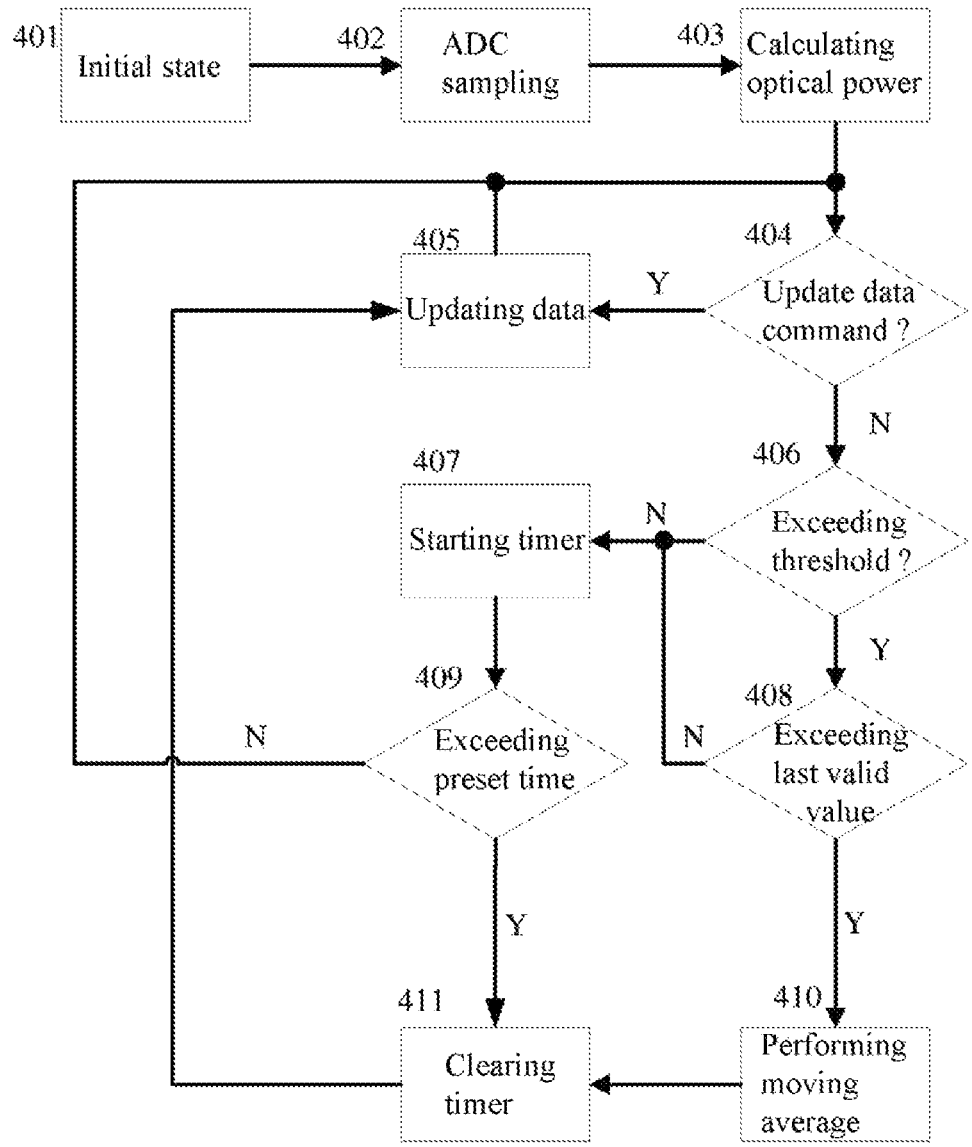
FIG. 4 is a schematic diagram of optical power detection.

As shown in FIG. 4, the following steps are specifically included:

Step 401, initializing an optical power detection module. Immediately after power up or reset is completed, the optical power detection module is in an initial state, in which the FPGA device 107 configures the ADC analog-digital conversion chip 106, and after the configuration is completed, proceeding to step 402.

Step 402, performing ADC sampling. The ADC analog-digital conversion chip 106 continuously samples, i.e. entering an ADC sampling state.

Step 403, calculating optical power from an ADC sampling result. The FPGA device 107 reads the sampling data of the ADC analog-digital conversion chip 106, and calculates the optical power based on an algorithm or a look-up table.

Step 404, performing a data update operation by determining whether an update data command is received, proceeding to step 405 when the update data command is received, otherwise proceeding to step 406.

Proceeding to step 405 if the optical power detection module receives the update data command at this time; proceeding to step 406 if the optical power detection module does not receive the data update command at this time.

Step 405, updating data with a current optical power value, and returning to step 404.

Updating the data output by the corresponding optical power detection circuit with the optical power data calculated by the FPGA device 107, and then returning to step 404 to wait for starting a next data update process.

Step 406, determining whether the optical signal is detected, proceeding to step 407 when the optical signal is not detected, otherwise, proceeding to step 408.

Comparing the optical power value calculated by the FPGA device 107 with a preset threshold, when the optical power value is less than the preset threshold, it indicates that what is detected by the sampling at this time is in a non-optical-signaled state, and the data is invalid, proceeding to step 407; when the power value exceeds the preset threshold, it indicates that what is detected by the sampling at this time is in an optical-signaled state, proceeding to step 408.

Step 407, starting an internal timer timing, and then proceeding to step 409.

Step 408, determining whether the optical power value is valid, proceeding to step 407 when the optical power value is invalid, otherwise, proceeding to step 410.

Comparing the currently detected optical power value with the optical power value (valid value) detected at last time, if the currently detected optical power value is less than the optical power value detected at last time, the current optical power value is considered to be invalid, proceeding to step 407 to start the internal timer, otherwise, the current optical power value is considered to be valid, proceeding to step 410.

Step 409, determining whether a timing time of the timer reaches a preset delay, if the preset delay is reached, proceeding to step 411, otherwise, proceeding to step 404.

And accumulating the timing time after the internal timer is started, determining whether the accumulated timing time exceeds a preset time, proceeding to step 411 when the timing time of the timer exceeds the preset time, and proceeding to step 404 if the timer does not overflow.

Step 410, performing a moving average on the currently detected optical power value with the optical power value obtained from the previous N detections to obtain the current optical power value to reduce the influence of noise interference, and then proceeding to step 411, wherein N is 16-128 and may be dynamically adjusted according to the real-time requirements of the detection apparatus.

Step 411, resetting the internal timer, and proceeding to step 405.

Clearing the internal timer, and updating the data output by the corresponding optical power detection circuit with the currently detected optical power value, and proceeding to a next process.

Specifically, when no optical signal is transmitted for a long time on the corresponding optical path detected by the optical power detection circuit, the detected optical power will always be less than the preset threshold. Therefore, the delay is firstly performed by setting the timer to determine whether it is in a non-optical-signaled state for a short time, and when the timer overflows, it indicates that there is no light over the optical fiber for a long time, and the last valid value (valid value after performing the moving average) is no longer maintained, and the output data is updated with the current optical power value read at this time. By dynamically adjusting the length of timing of the timer, the actual state of the optical signal over the fiber may be reflected in real time; by dynamically adjusting the threshold size, the invalid power range is determined to meet different system requirements; from the above mode, the latest valid value detected is stored, a large number of invalid values are filtered, and the optical signal size of the service data over the optical fiber is accurately reflected.

The present disclosure also provides a method for detecting gain of an optical amplifier, comprising: simultaneously outputting a clock signal and a control signal on a hardware through a synchronous control logic by an FPGA device 107, such that an ADC analog-digital conversion chip 106 of each optical power detection circuit simultaneously samples, and strict synchronization clock is internally performed on the data, and input and output optical power is simultaneously obtained. An accurate gain is obtained by determining the validity of the optical power.

Figure 5:
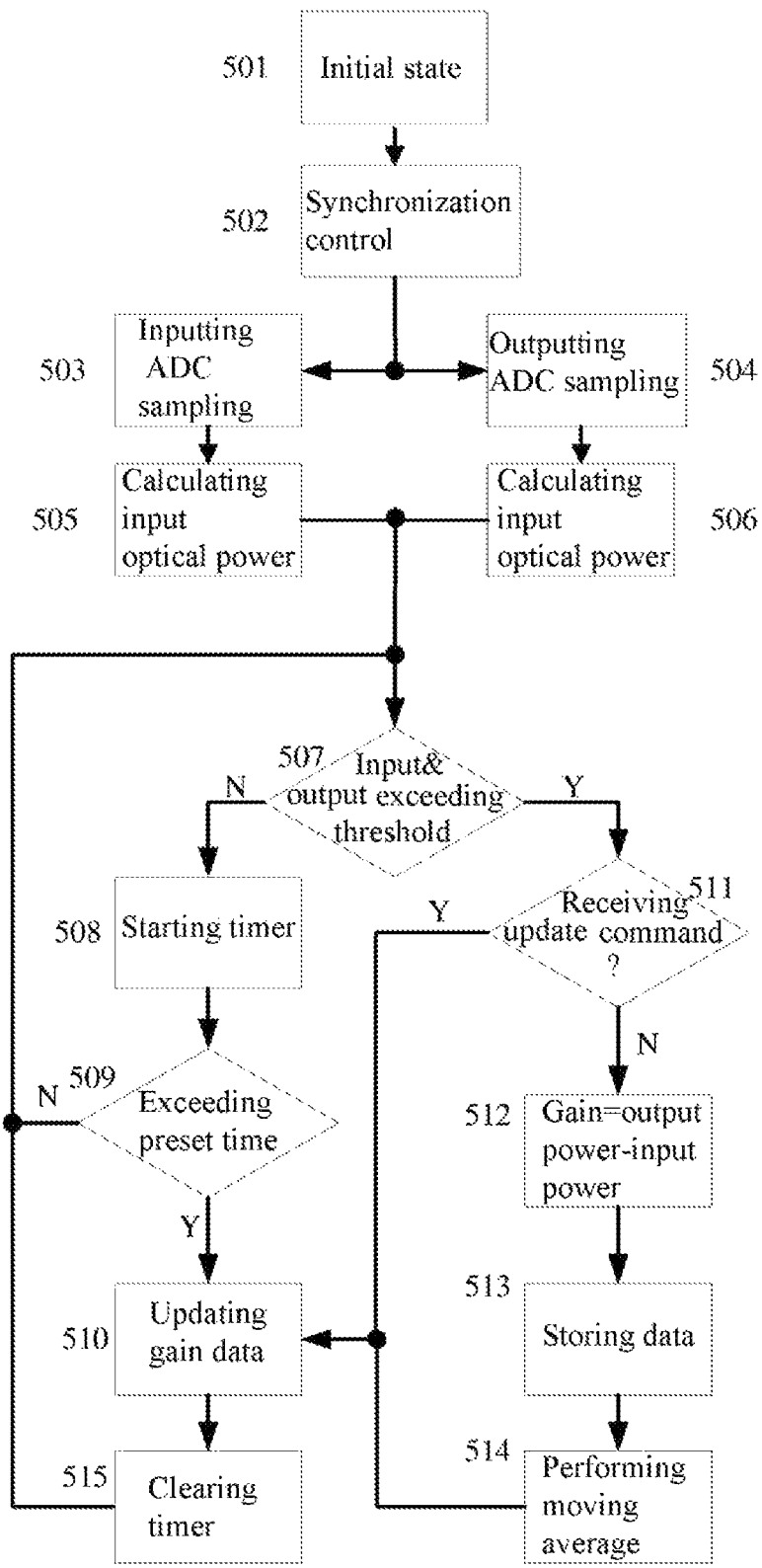
FIG. 5 is a schematic diagram of gain control and calculation.

With reference to the flowchart described in FIG. 5, the method for detecting the gain by the FPGA device 107 will be further explained. Immediately after power up or reset is completed, the gain detection module in the FPGA device 107 is in an initial state 501, completing initialization of a variable and a storage space, and then proceeding to a synchronization control state 502, ensuring that the clock and control signals of the ADC analog-digital conversion chip 106 in each detection circuit are completely identical, such that the ADC analog-digital conversion chip in an input channel and the ADC analog-digital conversion chip in an output channel operate in the simultaneous sampling states 503, 504, calculating the input optical power of the input channel 505 and the input optical power of the output channel 506, respectively, and an internal algorithm of the FPGA device 107 ensures the synchronization of the input optical power of the input channel and the input optical power of the output channel. Then determining the validity of the detected input optical power (i.e. the optical power input from the input channel) and the output optical power (i.e. the optical power input from the output channel) 507, i.e. whether the detected input and output optical power exceed a preset threshold. When the detected input optical power or output optical power is less than the preset threshold, it indicates that the detected input optical power or output optical power is an invalid value, and the timer is started 508. If a timing time is exceeded 509, gain data is updated 510, at the same time, a current gain value is indicated as invalid data, the timer is cleared 515, a next gain detection process is to be performed. When a valid value is detected, it is determined whether an update command is received 511. If the update command is received, the gain data is updated immediately 510, otherwise, the gain of the optical amplifier is calculated from the input optical power and the output optical power 512, the gain data is stored 513, the moving average is performed 514, the gain data is updated with the data after performing the moving average 510, and the timer is cleared 515, a next gain data calculation process is to be performed.

Figure 6:
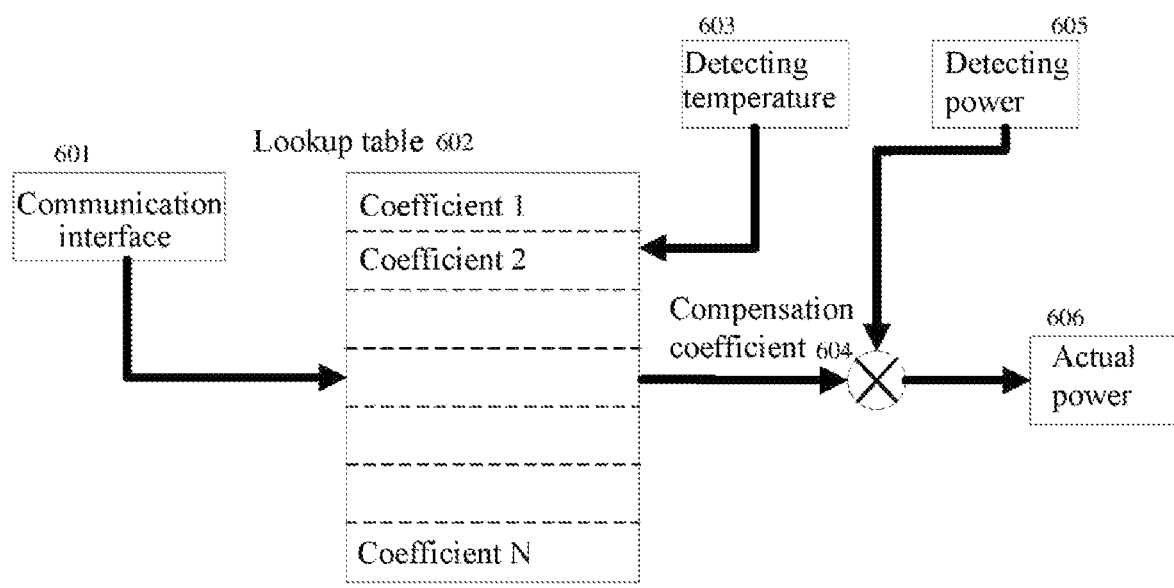
FIG. 6 is a schematic diagram of temperature compensation.

The temperature compensation method will be further explained with reference to the flowchart described in FIG. 6. The system configures a temperature compensation coefficient table 602 through a communication interface 601, and the temperature compensation coefficient table 602 is stored inside the FPGA device 107 in form of a lookup table. The temperature detection circuit obtains environment temperature 603 at the optical amplifier through the temperature sensor 108, and transmits the environment temperature data at the optical amplifier to the FPGA device 107. The FPGA device 107 obtains a compensation coefficient 604 by looking up the table according to the environment temperature data value, and multiplies the compensation coefficient 604 with the currently detected power 605 to obtain the actual optical power 606 at the current temperature, thus improving the accuracy of the system detection.

The present disclosure achieves multiple optical signals and gain circuits operate simultaneously by simply copying the control module in the FPGA device 107, and the external devices used may be significantly reduced.

The above embodiments are only one embodiment mode of the present disclosure, and the description thereof is more specific and detailed, but is not to be construed as limiting the scope of the present disclosure. The specific structure and size may be accordingly adjusted according to actual needs. It should be noted that a number of variations and modifications may be made by those skilled in the art without departing from the spirit and scope of the present disclosure.

What is claimed is:

1. An apparatus for detecting optical power and gain of an optical amplifier in a burst mode, characterized in comprising: multiple optical power detection circuits, an FPGA device, and a temperature detection circuit;
wherein each optical power detection circuit adopts the same structure and implementation mode, and comprises a photoelectric converter, a trans-impedance amplifier, an analog signal conditioning circuit, a filter and an analog-digital conversion chip which are respectively independent;
in each optical power detection circuit, the photoelectric converter is used to convert an optical signal of a corresponding optical path into a current signal, the trans-impedance amplifier is used to convert the current signal output by the photoelectric converter into a voltage signal, the analog signal conditioning circuit is used to correct the voltage signal output by the trans-impedance amplifier, amplify and translate the voltage signal, the filter is used to filter out a high frequency interference signal in the voltage signal output by the analog signal conditioning circuit, the analog-digital conversion chip converts the filtered analog voltage signal into a digital signal and outputs the same to the FPGA device; the FPGA device calculates optical power and gain of each optical path from the digital signal input by the corresponding optical path, and
wherein the FPGA is provided with a control module to enable the multiple optical power detection circuits to operate simultaneously.

2. The apparatus for detecting optical power and gain of an optical amplifier in a burst mode of claim 1, characterized in that, the temperature detection circuit comprises a temperature sensor for detecting temperature of the optical amplifier and converting the detected temperature into a digital signal and then transmitting the digital signal to the FPGA device, and the FPGA device compensates the obtained optical power and/or gain based on the detected temperature value.

3. The apparatus for detecting optical power and gain of an optical amplifier in a burst mode of claim 1, characterized in that, the FPGA device further includes a communication interface for setting a power threshold, a time interval of a timer, and a temperature compensation coefficient.

4. The apparatus for detecting optical power and gain of an optical amplifier in a burst mode of claim 1, characterized in that, the optical amplifier is a Raman fiber amplifier, an erbium-doped fiber amplifier, an ytterbium-doped fiber amplifier, a hybrid fiber amplifier, or a high-power fiber amplifier.

5. The apparatus for detecting optical power and gain of an optical amplifier in a burst mode of claim 1, characterized in that, an analog signal detected by each optical power detection circuit is converted into a digital signal by the analog-digital conversion chip and transmitted to the FPGA device, the FPGA device calculates actual optical power based on a calibration coefficient prestored in a parameter table; when the actual optical power exceeds a set threshold, a detection state machine inside the FPGA device is triggered, the FPGA device performs a moving average on valid optical power, records a valid value thereof, and performs a power determination at the same time, only when a detected optical power value at this time exceeds an optical power value detected at last time, a numerical value in a memory inside the FPGA device is updated, otherwise, the detected optical power value at this time will be abandoned, so that it is ensured that what is stored in the memory inside the FPGA device is the maximum optical power value in the burst mode.

6. The apparatus for detecting optical power and gain of an optical amplifier in a burst mode of claim 5, characterized in that, a timer is provided inside the FPGA device, when the numerical value in the memory inside the FPGA device is updated, the timer starts timing, when a timing time exceeds a set value, or an update command is received by the FPGA device through a communication interface, the numerical value in the memory inside the FPGA device is updated again.

7. The apparatus for detecting optical power and gain of an optical amplifier in a burst mode of claim 1, characterized in that, the FPGA device further comprises a temperature compensation parameter table for using temperature data input by the temperature detection circuit to compensate an optical power calculation.

8. A method for detecting optical power of an optical amplifier, characterized in comprising:
step 401, initializing an optical power detection module, in an initial state, configuring an analog-digital conversion chip in each optical power detection circuit by an FPGA device, and after the configuration is completed, proceeding to step 402;
step 402, starting ADC sampling, continuously sampling and outputting converted optical power data to the FPGA device by the analog-digital conversion chip, proceeding to step 403;
step 403, reading, by the FPGA device, sampling data input by the analog-digital conversion chip, calculating, by the FPGA device, currently detected optical power, and proceeding to step 404;
step 404, determining whether to perform a data update operation by determining whether an update data command is received, if the update data command is received, proceeding to step 405, otherwise proceeding to step 406;
step 405, updating data with a current optical power value, and returning to step 404;
step 406, comparing the optical power value calculated by the FPGA device with a preset threshold, when the optical power value is less than the preset threshold, indicating that what is detected by the sampling at this time is in a non-optical-signaled state and the data is invalid, proceeding to step 407; when the power value exceeds the preset threshold, indicating that what is detected by the sampling at this time is in an optical-signaled state, proceeding to step 408;
step 407, starting an internal timer timing, and then proceeding to step 409;
step 408, comparing the currently detected optical power value with the optical power value detected at last time, if the currently detected optical power value is less than the optical power value detected at last time, the current optical power value being considered to be invalid, proceeding to step 407, otherwise, the current optical power value being considered to be valid, proceeding to step 410;
step 409, determining whether a timing time of the internal timer reaches a preset delay, if the preset delay is reached, proceeding to step 411, otherwise, proceeding to step 404;
step 410, performing a moving average on the currently detected optical power value with the optical power value obtained from previous N detections to obtain the current optical power value to reduce influence of noise interference, and then proceeding to step 411;

step 411, resetting the internal timer, and proceeding to step 405, wherein the FPGA device completes initialization of a variable and a storage space, and then enters a synchronization control state to ensure that a clock signal and a control signal of an ADC analog-digital conversion chip in each detection circuit are completely identical, such that the ADC analog-digital conversion chip in an input channel and the ADC analog-digital conversion chip in an output channel operate in the simultaneous sampling states.

9. The method for detecting optical power of an optical amplifier of claim 8, characterized in that, the FPGA device stores a temperature compensation coefficient table in form of a lookup table, obtains the compensation coefficient by looking up the table according to temperature data input by the temperature detection circuit, and multiplies the compensation coefficient with the currently detected power value to obtain an actual optical power value at the current temperature.

10. A method for detecting gain of an optical amplifier, characterized in comprising:

completing, by an FPGA device, initialization of a variable and a storage space, and then entering by the FPGA device, a synchronization control state to ensure that a clock signal and a control signal of an ADC analog-digital conversion chip in each detection circuit are completely identical, such that the ADC analog-digital conversion chip in an input channel and the ADC analog-digital conversion chip in an output channel operate in the simultaneous sampling states;

calculating, by the FPGA device, input optical power of the input channel and input optical power of the output channel, respectively, and then determining, by the FPGA device, validity of a detected input optical power and output optical power;

when the detected input optical power or output optical power is less than a threshold, indicating that an invalid value is detected, and starting a timer; if a timing time is exceeded, updating gain data and at the same time indicating a current gain value as invalid data, clearing the timer, and performing a next gain detection process;

when the detected input optical power or output optical power is greater than the threshold, indicating that a valid value is detected, and determining whether an update command is received, if the update command is received, updating the gain data immediately, otherwise, calculating the gain of the optical amplifier from the input optical power and output optical power, storing the gain data, performing a moving average, and updating the gain data with data after performing the moving average, clearing the timer, and performing the next gain detection process.

\* \* \* \* \*